US006639848B2

United States Patent
Maejima (10) Patent No.: US 6,639,848 B2
(45) Date of Patent: Oct. 28, 2003

(54) SEMICONDUCTOR MEMORY DEVICE AND METHOD FOR TESTING THE SAME

(75) Inventor: Hiroshi Maejima, Chigasaki (JP)

(73) Assignee: Kabushiki Kaisha Toshiba, Minato-Ku (JP)

(*) Notice: Subject to any disclaimer, the term of this patent is extended or adjusted under 35 U.S.C. 154(b) by 0 days.

(21) Appl. No.: 10/198,079

(22) Filed: Jul. 19, 2002

(65) Prior Publication Data

US 2003/0026136 A1 Feb. 6, 2003

(30) Foreign Application Priority Data

Jul. 23, 2001 (JP) ........................................ 2001-221920

(51) Int. Cl.[7] .............................................. G11C 16/04
(52) U.S. Cl. ................... 365/189.07; 365/201; 365/200
(58) Field of Search ........................... 365/189.07, 201, 365/200, 225.7; 714/718

(56) References Cited

U.S. PATENT DOCUMENTS 5,859,804 A * 1/1999 Hedberg et al. ............. 365/201
5,917,764 A * 6/1999 Ohsawa et al. ............. 365/200
6,091,649 A * 7/2000 Choi ........................... 365/200

FOREIGN PATENT DOCUMENTS

JP     2001-067893     3/2001

* cited by examiner

Primary Examiner—Anh Phung
(74) Attorney, Agent, or Firm—Banner & Witcoff, Ltd.

(57) ABSTRACT

A semiconductor memory device is provided which can apply a redundancy circuit replacement program to cells by a DS testing in a parallel testing state. That is, in this semiconductor memory device, when the redundancy circuit replacement is effected on an electrically programmable nonvolatile memory device, an internal circuit is so provided as to detect a defect chip retrievable on a DS tester while being in a parallel testing state as well as address information contained in the defect chip and, by doing so, it is possible to achieve the redundancy circuit replacement.

21 Claims, 8 Drawing Sheets

| FUSE_n | FADDI_n |
|---|---|
| Exist | bFADD_n |
| Blown | FADD_n |

| FOUT_n | FADDI_n |
|---|---|
| H | bFADD_n |
| L | FADD_n |

F I G. 17B

SEMICONDUCTOR MEMORY DEVICE AND METHOD FOR TESTING THE SAME

CROSS-REFERENCE TO RELATED APPLICATIONS

This application is based upon and claims the benefit of priority from the prior Japanese Patent Application No. 2001-221920, filed Jul. 23, 2001, the entire contents of which are incorporated herein by reference.

BACKGROUND OF THE INVENTION

1. Field of the Invention

The present invention relates to a semiconductor memory device and to a semiconductor memory device allowing a redundancy circuit replacement on an electrically programmable nonvolatile memory element and a method for testing the same and, in particular, this enables the replacement of the redundancy circuit to be programmed while being in a parallel testing state in an die-sort test.

2. Description of the Related Art

In a semiconductor memory such as a DRAM, a die-sorting test (hereinafter referred to as a DS test) is made by a tester before a shipment to detect any fail chip. The DS test comprises a DC test for monitoring electric current and voltage or an AC test for confirming a basic read/write operation by varying the test pattern and voltage, and so on. In this DS test, a parallel testing is carried out so as to shorten a normal test time.

The "parallel testing" means testing a plurality of chips by the same DS tester at a time in a parallel state on one wafer. In this case, it is only possible to apply all the same voltage waveform, including a timing, to the same signal pad of respective chips. Stated in more detail, when a voltage waveform of, for example, a high level → a low level → a high level (here, a high level is referred to as a "H" level and a low level as a "L" level) is applied to a /RAS pad of a specified chip, al the same voltage waveform is applied also to a /RAS pad of another chip.

After the ending of the DS test, whether each chip including any fail bit is retrievable (pass) or not (fail) by a redundancy circuit replacement is decided based a fail bit address detected by the test and this decision is so done under a software using any calculation algorithm.

The redundancy circuit replacement has now been extensively utilized in the field of the semiconductor memory and any fail memory cell can be retrieved through the redundancy cell replacement, thus achieving an improved yield. Normally, a plurality of rows or columns in the memory cell array are set as a cell array unit for retrieval and any defect-detected cell array unit is replaced by a redundancy cell (spare element) unit of the same size.

If, therefore, any defect bit containing unit so detected by the DS test is replaceable all with the redundancy circuit, its chip is "passed" while, on the other hand, if it is not replaceable, its chip "fails". For only the chip decided as being "passed", the redundancy circuit replacement is programmed in a hardware way.

Those programmed contents are address information of a defect-containing cell array unit to be replaced with a redundancy cell array unit. For the storage of such information it is necessary to use a nonvolatile memory element. A laser fuse is now commonly used for a program to allow a connection line to be blown with a laser irradiation from a laser blowing machine and, as its material, use is made of a metal, a polysilicon and so on.

With a large increase in the memory capacity, a total number of such laser fuses are inevitably increased and, since the pitch (the size of one fuse and its adjacent fuse interval) of fuses is determined by the performance of the laser blowing machine, it has been difficult to follow the scaling of the design rules for miniaturization. And a relative occupation percentage of such laser fuses in a chip becomes greater.

One solution to this problem is by replacing a conventional laser fuse with an electrically programmable fuse (here referred to as an EFUSE) or a nonvolatile semiconductor memory element. Here, the EFUSE is comprised of a fuse programmed by electrically short- or open-circuiting the connection line, etc., formed of a capacitor's insulating film, a metal and a polysilicon by the application of a voltage or current.

As one example, an EFUSE is listed here which is programmed by applying high voltage to a capacitor's insulating film in a DRAM cell to cause it to be broken down and thus cause it to be electrically short-circuited. Further, here, the nonvolatile semiconductor memory element generally means a flash memory, an EEPROM, an FeRAM (Ferroelectric RAM), an MRAM (Magnetic RAM) cell, etc., serving as a nonvolatile semiconductor memory having a read, a write and a data hold function. Here, for convenience's sake, the EFUSE and nonvolatile semiconductor memory element, together, are called as an electrically programmable nonvolatile memory element.

In the EFUSE programmed by breaking down the capacitor's insulating film of the DRAM cell, for example, it follows that, with the miniaturization of the semiconductor memory, the EFUSE section is correspondingly scaled down. It is, therefore, possible to reduce the occupation area of a chip compared with that of the laser fuse. Further it is also possible to secure a fail bit retrieval after a burn-in testing (after a package sealing).

It is considered that, in the future, the redundancy circuit replacement fuse will be wholly replaced with the electrically programmable nonvolatile memory element in place of the now generally used laser fuse. Here, a problem lies in how to reduce a time necessary for such programming and hence reduce a testing time and cost when a program operation is applied to an electrically programmable nonvolatile memory element.

In general, the electrically programmable nonvolatile memory element can be used to store address information of a cell array unit including a defect. As an example using an EFUSE to store the address information, an explanation will be made below in more detail about the conventional program operation.

Figure 1:
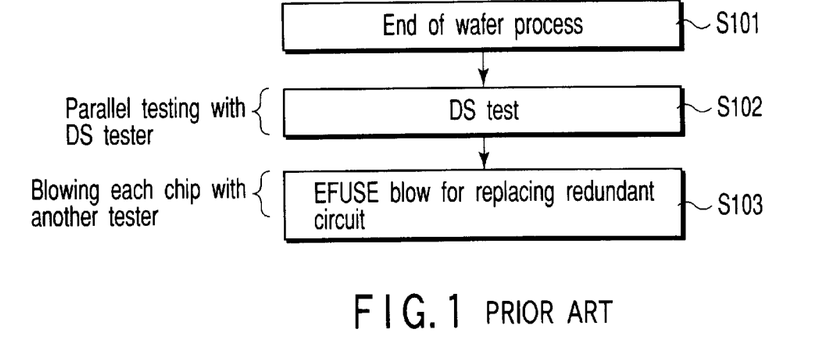
FIG. 1 is a view showing a testing flow of a conventional semiconductor memory device.

A test flow for the conventional redundancy circuit replacement will be explained below by referring to FIG. 1.

In the ending of a wafer process S101, a resultant memory wafer is shifted to a DS test. In the DS test S102, checking is made, by the DS tester, for any defect chip in a parallel testing so as to enhance the test efficiency. Whether any defect chip is retrievable or not with a redundancy circuit replacement is decided based on a defect bit included in a defect chip detected by the DS tester in the parallel testing state. If the defect chip is decided as being retrievable, shifting is made to an EFUSE blowing step S103 for the redundancy circuit replacement. Here the "blowing" means the operation of programming a fuse.

In the parallel testing state, however, a plurality of chips are tested in parallel by the same DS tester at a time and all the same voltage waveform including a timing is applied to the same signal pad of the respective chip. It is, therefore, not possible to execute any redundancy circuit replacement program on the defect chip only by directly using the DS tester in a parallel testing state.

It is, therefore, necessary to again test a plurality of chips in a parallel testing state one by one by another tester and execute a redundancy circuit replacement program for any defect chip. This method takes a longer time for the redundancy circuit replacement and involves a rise in a testing cost.

Figure 2:
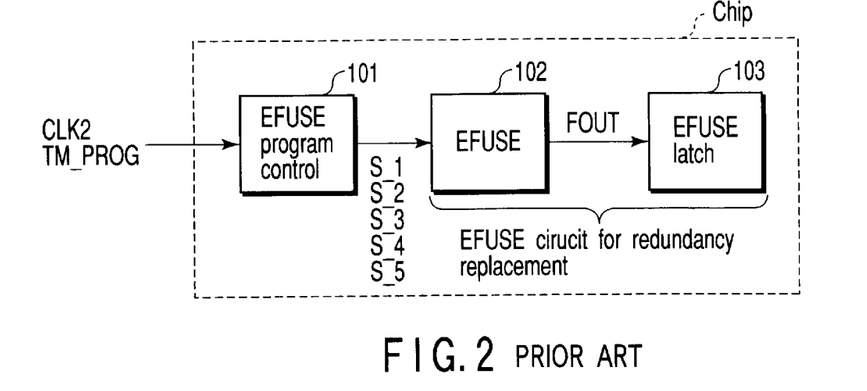
FIG. 2 is a view showing an internal circuit arrangement of the conventional semiconductor memory device.

With reference to FIG. 2 an explanation will be made below about a conventional main circuit arrangement in the case of using the EFUSE for the redundancy circuit replacement.

(1) EFUSE Programming Operation

As shown in FIG. 2, an EFUSE program control circuit 101 receives a clock signal CLK2 and a program signal TM_PROG and outputs a plurality of control signals S_1, . . . , for the EFUSE program operation.

An EFUSE circuit 102 for executing the EFUSE program operation is controlled with the use of the plurality of control signals S_1, S_2, S_3, S_4 and S_5 and the EFUSE program operation is executed by applying a program pulse (voltage VBP) to an address-selected EFUSE.

(2) EFUSE Read Operation

In the EFUSE read operation, the contents programmed in the EFUSE are read out and the redundancy circuit replacement is executed. With the use of these control signals S_1, S_2, S_3, S_4 and S_5, the EFUSE circuit 102 delivers the program state of the EFUSE as an output signal FOUT and, with the use of this signal, controls an EFUSE latch circuit 103.

The EFUSE latch circuit 103 receives the output signal FOUT and, in accordance with the state of the latch circuit, replaces a defect bit including cell array with a redundancy cell array.

Figure 3:
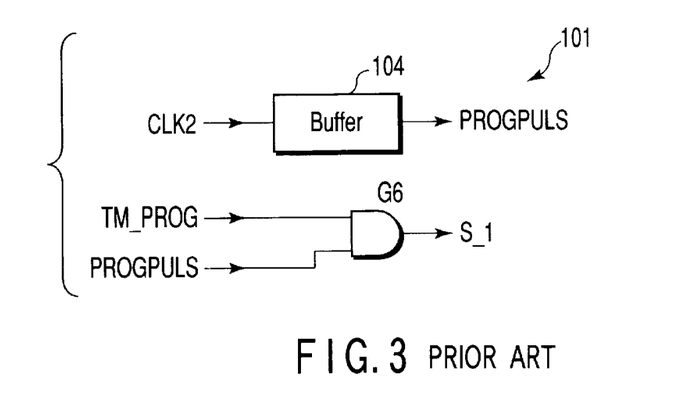
FIG. 3 is a view showing an arrangement of an EFUSE program control circuit in the conventional semiconductor memory device.

FIG. 3 shows a part of a structure of a conventional EFUSE program control circuit 101. Upon receipt of a clock CLK2, a program pulse signal PROGPULS for programming the EFUSE is outputted through a buffer 104. An AND gate G6 receives a program signal TM_PROG and program pulse signal PROGPULS and outputs a control signal S_1 for use in the EFUSE program operation. Here, in addition to the circuit for outputting the control signal S_1, those circuits for outputting the control signals S_2, S_3, S_4 and S_5 are also included but these are neglected because they are not essential.

Figure 4:
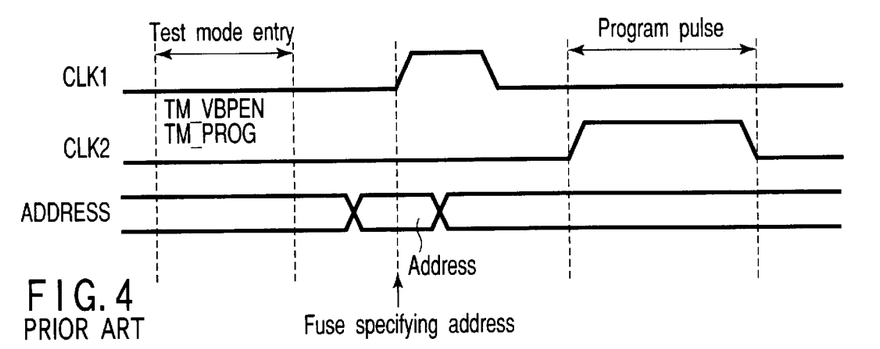
FIG. 4 is a timing waveform diagram showing the operation of an internal circuit in the conventional semiconductor memory device.

FIG. 4 shows one example of a conventional timing waveform for programming the EFUSE. In a WCBR (Write CAS Before RAS) cycle, etc., of a tester, a test mode is entered for a program operation to be performed. By a program signal TM_PROG and program voltage VBP enable signal TM_VBPEN it is possible to execute an EFUSE program operation.

A fuse specifying address for specifying the programming of any specific EFUSE at a program operation time is taken in at a rising edge of a clock CLK1. Then a program pulse for specifying a pulse application time necessary for the programming of the EFUSE is inputted by a clock pulse CLK2. By doing so, with the program pulse set at a "H" level time, a program pulse voltage VBP is applied to a specified EFUSE to allow the EFUSE to be programmed.

In general, for the address taken-in, a time of about 100 ns is adequate but the application time of the program pulse voltage VBP requires about 1 ms though depending upon the characteristics of the EFUSE. Therefore, the time required for the take-in of the address can be negligible at the program operation of the EFUSE as shown in FIG. 4.

It is desirable that, in order to achieve the reduction of the testing time and cost, ideally the redundancy circuit replacement program be executed, while being in a parallel testing state, on the same DS tester on the basis of a result of decision, at the end of the DS test, as to whether the chip is retrievable or not (PASS or FAIL). In the present situation, however, it has not been possible to execute a redundancy circuit replacement program while being in a parallel testing state.

For this reason, it is necessary to again program an electrically programmable nonvolatile memory element by another tester on a chip-by-chip basis. Therefore, a longer time is required for testing and a testing cost is raised, thus presenting a problem.

As set out above, the conventional semiconductor memory device is such that the electrically programmable nonvolatile memory device needs to be programmed chip by chip by another tester for redundancy circuit replacement. This method presents a problem of incurring an added cost.

BRIEF SUMMARY OF THE INVENTION

In one aspect of the present invention there is provided a semiconductor memory device comprising an address comparing circuit configured to make a comparison between a chip specifying address applied from an outside and a chip address programmed in a first nonvolatile memory element, a control circuit configured to control an activating state of an internal circuit included in the semiconductor memory device by using a result of comparison, and a test mode which activates the address comparing circuit and control circuit.

In another aspect of the present invention there is provided a method for testing a semiconductor memory device using a memory wafer formed by the ending of a wafer process and a tester for testing a plurality of memory chips on the memory wafer in a parallel testing state, the plurality of memory chips each having an internal circuit for allowing a redundancy circuit replacement, the method comprising; allowing a first nonvolatile memory element which is formed in a respective memory chip to be programmed with a chip address of the corresponding memory chip, testing the plurality of chips in a parallel testing state, making a comparison between the chip address of the respective memory chip and an externally applying chip specifying address of a chip retrievable with a redundancy circuit replacement and detecting a chip retrievable, in a parallel testing state, with the redundancy circuit replacement and allowing programming to be done on a second electrically programmable nonvolatile memory element in the internal circuit with the redundancy circuit replacement.

DETAILED DESCRIPTION OF THE INVENTION

The embodiments of the present invention will be described below in more detail by referring to the accompanying drawing.

(First Embodiment)

Figure 5:
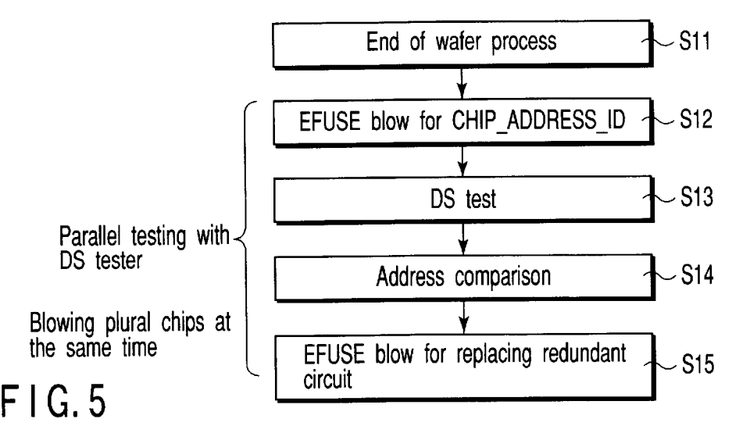
FIG. 5 is a view showing a testing flow of a semiconductor memory device according to a first embodiment.
Figure 6:
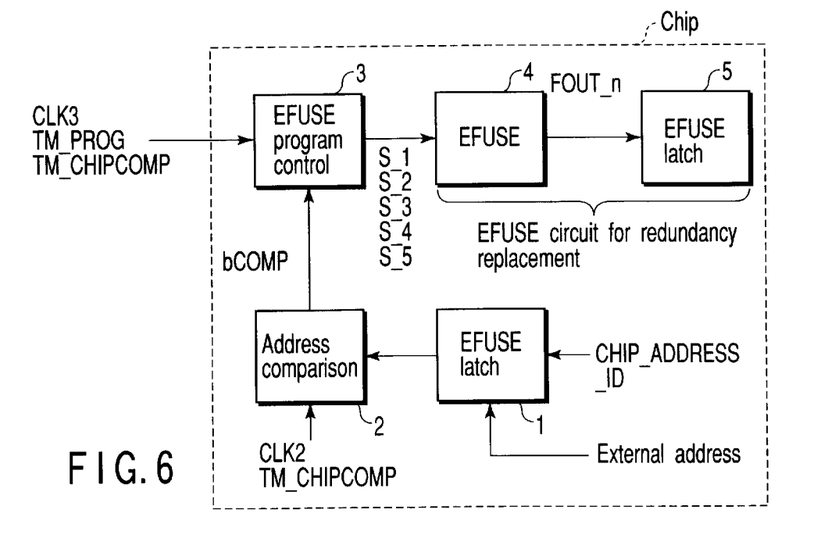
FIG. 6 is a view showing an internal circuit arrangement of the semiconductor memory device according to the first embodiment.

With reference to FIGS. 5 and 6, an explanation will be made below about a method for testing a semiconductor memory device according to a first embodiment and a main arrangement of a chip's internal circuit necessary for testing. In the first embodiment, an explanation will be made below about the method for testing a semiconductor memory device allowing redundancy circuit replacement by a DS tester in a parallel testing state and about a chip's internal circuit.

Further, an explanation will be made below about the case of programming an EFUSE for redundancy circuit replacement and programming the EFUSE also with the chip address of all chips formed on a wafer which is necessary for replacement by the redundancy circuit while being in a parallel testing state. Stated in more detail, these EFUSEs cover the case of being programmed by breaking down a capacitor's insulating film of a DRAM cell.

FIG. 5 is a view showing a flow of the method for testing a semiconductor memory device according to a first embodiment. First, at the ending of a wafer process at step S11, a resultant memory wafer is shifted to a DS testing. Then, by the EFUSE blowing for CHIP ADDRESS_ID at step S12, a chip address CHIP_ADDRESS_ID is written in every chip with the use of an EFUSE write voltage VBP.

Then, at the DS testing at step S13, the DS testing is carried out with the use of the DS tester in a parallel testing state. By the DS testing, the address information of a defect bit in the respective chip and chip specifying address of the defect chip are taken in by the DS tester. If any chip including a defect bit is decided as being retrievable with a redundancy circuit replacement based on the address information of the defect bit, shifting is made to the redundancy circuit replacement operation.

Then at an address comparing step S14, an address comparing circuit in the chip makes a comparison between the chip specifying address outputted from the DS tester and the chip address CHIP_ADDRESS_ID. By doing so, only one chip included in a plurality of chips in a parallel testing state and having a matched chip address is detected as being retrievable with a redundancy circuit replacement.

Then with respect to the detected chip, an about 8V write voltage VBP is applied to the EFUSE at the EFUSE blowing step S15 while being in a parallel testing state on the same tester and the EFUSE blowing is effected for the redundancy circuit replacement.

In the test flow shown in FIG. 5, it is necessary to initially program every chip with a chip address CHIP_ADDRESS_ID. In the case of the parallel testing of for example 32 chips, however, if an EFUSE corresponding to five bits exists on the chips, it is possible to program (write) a chip address and the number of EFUSEs necessary for the programming of the chip address is very small per chip.

Further, the programming of the EFUSE for redundancy circuit replacement can be done while being in a parallel testing state and a total test time is very short compared with the conventional method in which the replacement by the redundancy circuit is effected at each bit. And it is possible to reduce a testing cost.

FIG. 6 is a view showing an arrangement of an internal circuit for replacement by a redundancy circuit on the chip of the semiconductor memory device which is necessary to the execution of the above-mentioned testing method. With the use of an EFUSE latch circuit 1 and address comparing circuit 2, a comparison is made between a chip address CHIP_ADDRESS_ID initially written on the chip address writing EFUSE and the specified chip address of a chip retrievable with the redundancy circuit replacement which is outputted as an externally applying address from the DS tester.

The address comparing circuit 2 is operated upon receipt of a clock CLK2 and chip comparing signal TM_CMIPCOMP and, if matching is made between the chip address CHIP_ADDRESS_ID and the chip specifying address of a defect chip from the DS tester, outputs a comparison signal bCOMP.

An EFUSE program control circuit 3 is operated upon receipt of a clock CLK3, program signal TM_PROG and chip comparing signal TM_CMIPCOMP and, upon receipt of a comparison signal bCOMP from the address comparing circuit 2, outputs control signals S_1 to S_5 for controlling the next stage EFUSE circuit.

Upon receipt of the control signals S_1 to S_5, the EFUSE circuit 4 allows the writing of the EFUSE (the breakdown of a cell capacitor's insulating film) connected to a cell array unit including a defect bit relating to a defect chip detected by the address comparing circuit 2 and the reading of the written EFUSE and it delivers an output as a control signal FOUT_n.

The EFUSE latch circuit 5 receives the control signal FOUT_n and converts the address of the EFUSE connected to the cell array unit of the chip including the defect bit and effects the redundancy circuit replacement.

In the semiconductor memory device according to the first embodiment, the chip's internal circuit for redundancy circuit replacement shown in FIG. 6 is less in circuit complexity and, if only 5 bit EFUSEs are added so as to identify each chip, for example, in a 32 parallel testing state, it is possible to provide a chip address CHIP_ADDRRESS_ID and, by doing so, it is possible to provide these chip's internal circuits in a proper available space.

In this way, the internal circuit for redundancy circuit replacement can be provided for each chip of a memory wafer and it is, therefore, possible to easily detect a chip retrievable with the redundancy circuit replacement by the DS tester in a parallel testing state and effect the redundancy circuit replacement.

(First Modified Embodiment)

Now, a modification (here called as a first modified embodiment) of the first embodiment will be described below with reference to FIGS. 7 and 8. In the first modified embodiment, the redundancy circuit replacement is effected with the use of an EFUSE but this modification is different from the first embodiment in that the writing of the chip address CHIP_ADDRESS_ID is effected using a laser fuse in place of the EFUSE.

Figure 7:
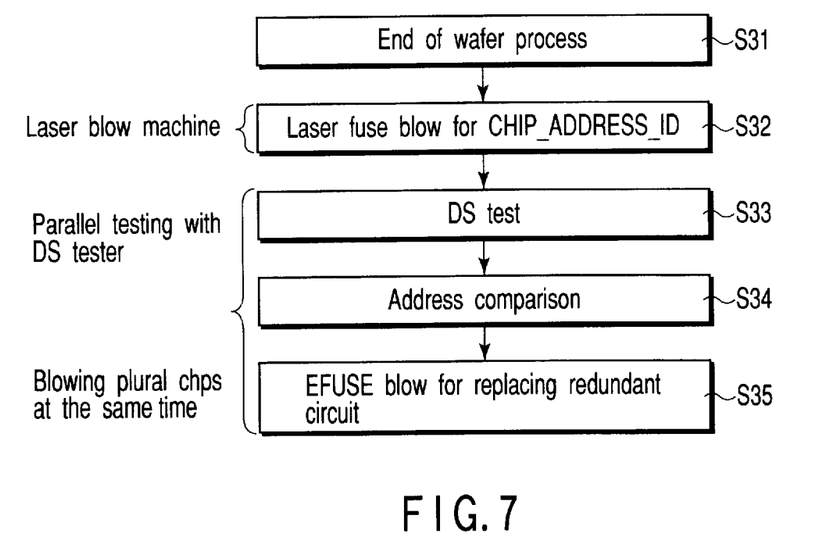
FIG. 7 is a view showing a testing flow of a semiconductor memory device according to a first modified embodiment.

FIG. 7 is a view showing a flow of a testing method associated with the first modified embodiment. At a laser fuse blowing step S32 of the CHIP_ADDRESS_ID, the chip address CHIP_ADDRESS_ID is written into all the chips with the use of a laser blowing machine, the remaining portion is substantially the same as that of the test flow of the first embodiment shown in FIG. 5 and any further explanation of it is, therefore, omitted.

In the test flow shown in FIG. 7, it is necessary to initially write the chip address CHIP ADDRESS_ID into all the chips with the use of the laser blowing machine. In a 32 parallel testing state it is only necessary to use laser fuses corresponding to five bits and the number of them is very small per chip.

Figure 8:
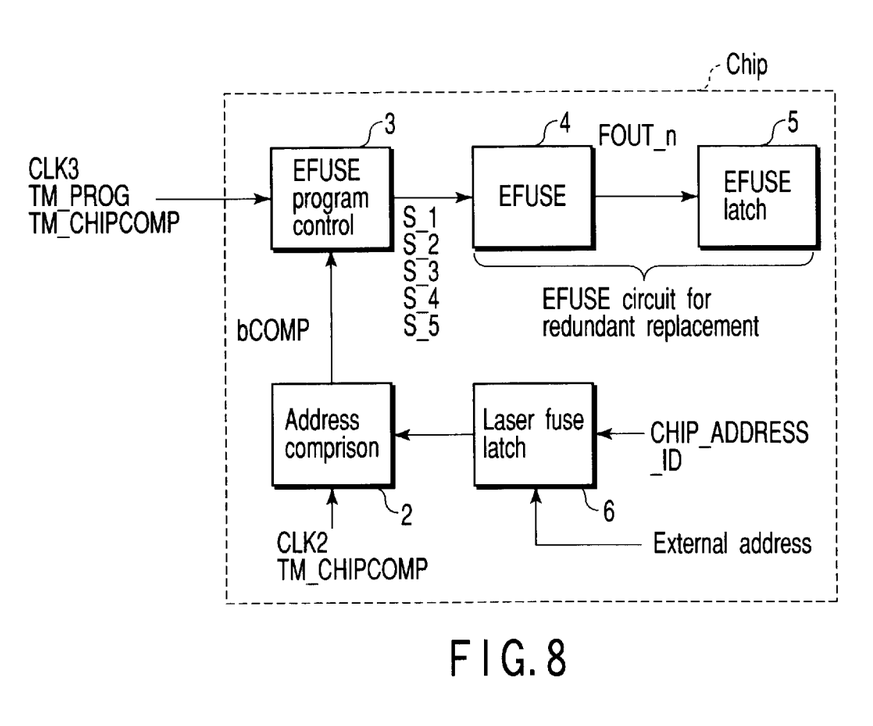
FIG. 8 is a view showing an internal circuit arrangement of a semiconductor memory device according to the first modified embodiment.

FIG. 8 is a view showing an arrangement of the chip's internal circuit for redundancy circuit replacement in the case where the writing of the chip address in the first modified embodiment is done with the use of the laser fuse. The chip address CHIP_ADDRESS_ID of all the chips is initially written into the laser fuses of the laser fuse latch circuit 6.

The operation of the laser fuse latch circuit 6 is substantially the same as that of the EFUSE latch circuit in FIG. 6 and the operation of the remaining circuit portion of the internal circuit shown in FIG. 8 is the same as that of the internal circuit of the semiconductor memory device shown in FIG. 6 and any detailed explanation of it is, therefore, omitted.

In this way, in the first embodiment in which the redundancy circuit replacement and chip address writing are performed all with the use of the EFUSE's and in the first modified embodiment in which the redundancy circuit replacement is done with the use of the EFUSE and the writing of the chip address is effected with the use of the laser fuse, it is possible to achieve these operations with the use of the same method and circuit.

In the first embodiment and first modified embodiment there are following common advantages.

In the case where a plurality of defect chips are present in parallel testing chips, it is possible to perform the program operation of the redundancy circuit replacement in a parallel fashion and it is possible to achieve the reduction of the testing time and testing cost.

Further, the redundancy circuit replacement method and the use of chip's internal circuit relating to the first embodiment and first modified embodiment are not necessarily restricted to the case where the EFUSE and laser fuse are used. These can generally also be applied to the case where the programmable nonvolatile memory element and so on are used.

At this time, in place of the chip address CHIP_ADDRESS_ID, use may be made of those holding the broader information such as the lot number, the wafer number, and X and Y coordinates of the chips in a wafer, conventionally called as the CHIP_ID. Thus the broader information holding CHIP_ID, if being also used as the CHIP_ADDRESS_ID, is covered within the range of the present invention.

Generally speaking, all the information format for mutually identifying simultaneously measuring chips in the replacement of a redundancy circuit by the DS testing in a parallel testing state is covered within a range of the present invention.

(Second Embodiment)

Figure 9:
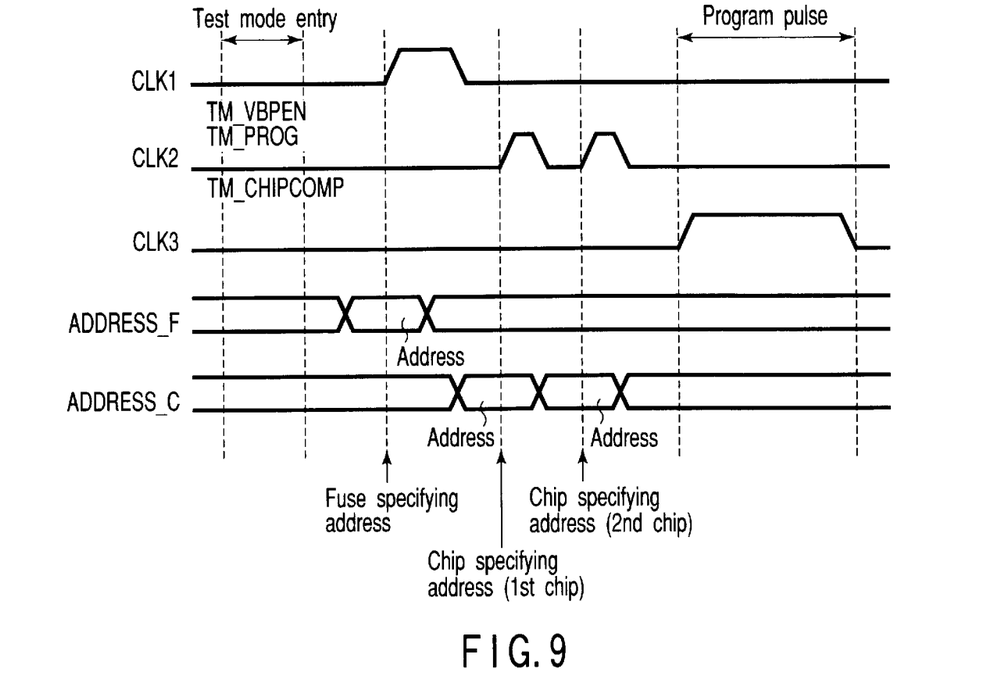
FIG. 9 is a timing waveform diagram showing the operation of an internal circuit according to a second embodiment.

With reference to FIG. 9 an explanation will be made below about the program operation for redundancy circuit replacement by a DS tester in a parallel testing state according to a second embodiment. FIG. 9 shows a timing waveform diagram of the program operation of the second embodiment.

An enable signal TM_VBPEN of a program voltage VBP applied to an EFUSE and program signal TM_PROG are inputted. After an entry to a test mode for programming the EFUSE, a specified fuse address ADDRESS_F for specifying which EFUSE in a chip should be programmed is taken in at a rising edge of a clock CLK1.

Then an address comparing circuit is operated by a chip comparing signal TM_CHIPCOMP and a chip specifying address ADDRESS_C for specifying which chip should be programmed from those chips all in a parallel testing state is taken in at the rising edge of a clock CLK 2.

The fuse specifying address ADDRESS_F for specifying which EFUSE should be programmed and chip specifying address ADDRESS_C for specifying which chip should be programmed may be data on different bus connection lines or data on a common address-multiplexed line.

A comparison is made between the chip specifying address ADDRESS_C outputted from the DS tester and the chip address CHIP_ADDRESS_ID initially programmed on the laser fuse and, when matching is made between both, a circuit for performing a program operation of the EFUSE for redundancy circuit replacement is activated. During a program pulse application time period in which a clock pulse CLK3 is in the "H" level, a pulse voltage VBP is applied to the EFUSE in the chip and the EFUSE is programmed.

(Second Modified Embodiment)

Figure 10:
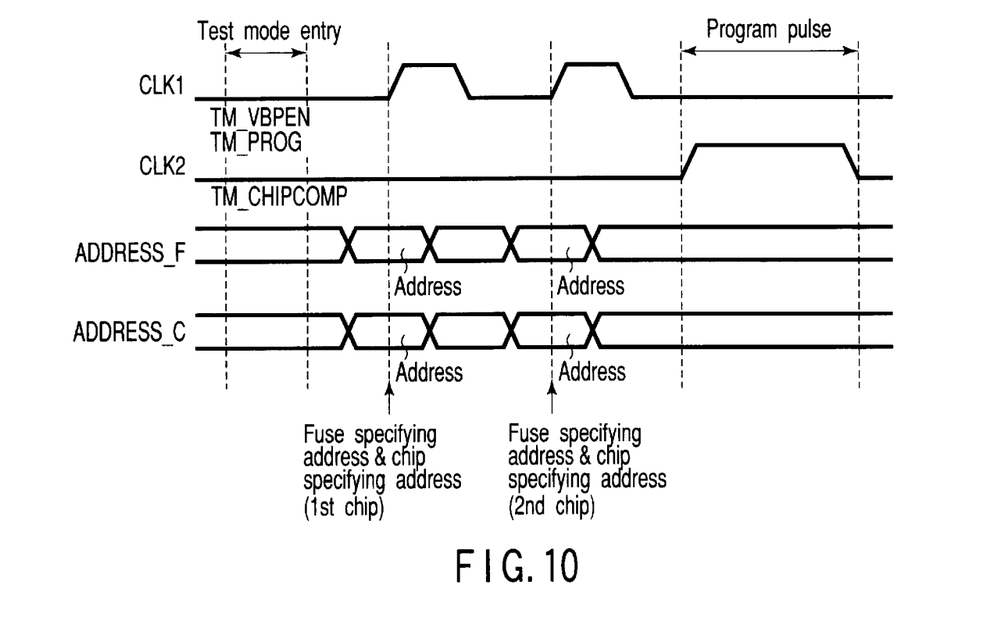
FIG. 10 is a timing waveform diagram showing an operation of an internal circuit according to a second modified embodiment.

With reference to FIG. 10, an explanation will be made below about a modification (here referred to as a second modified embodiment) of the second embodiment. In the timing waveform diagram of the program operation of EFUSEs shown in FIG. 10, after an entry to a test mode for programming the EFUSE, an address ADDRESS_F for specifying which EFUSE in the chip should be programmed and chip specifying address ADDRESS_C for specifying which chip in those parallel testing chips should be programmed are taken in at the same time at a rising edge of a clock CLK1.

A comparison is made between the externally specified chip address ADDRESS_C and the chip address CHIP_ADDRESS_ID initially programmed on a laser fuse and, when matching is made between both, a circuit for performing a program operation of the EFUSE for redundancy circuit replacement is activated. And during the "H" level time period of a clock CLK2 a program pulse voltage VBP is applied to the EFUSE in the chip and the EFUSE is programmed.

In the second embodiment and second modified embodiment, the program pulse application time is dominant compared with the address take-in time. Further, in the case where a plurality of defect chips exist in the parallel testing chips, the program operation of the EFUSEs can be executed in a parallel fashion with respect to these defect chips and there is an advantage in that it is possible to achieve the reduction of the testing time.

(Third Embodiment)

Figure 11:
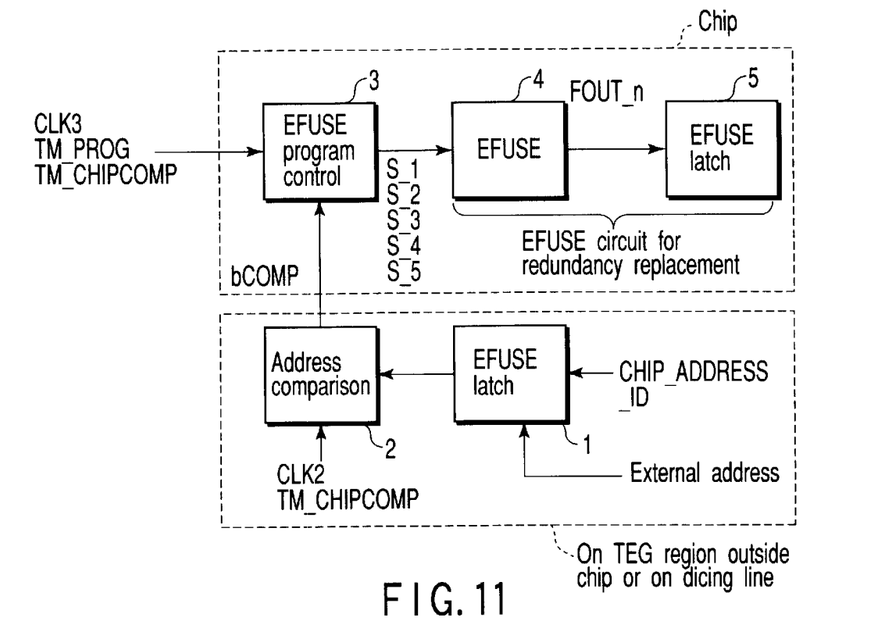
FIG. 11 is a view showing an internal circuit arrangement of a semiconductor memory device according to a third embodiment.

With reference to FIG. 11, an explanation will be made below about the semiconductor memory device according to a third embodiment.

In connection with a third embodiment, an explanation will be made below about a semiconductor memory device in which a portion of an internal circuit for redundancy circuit replacement by a DS tester in a parallel testing state is formed on a TEG (Test Element Group) region outside the chip or on a dicing line and it is connected by a connection line to a chip body.

In connection with the third embodiment an explanation will be made below about the case where, as in the case of the first embodiment, the writing of the chip address CHIP_ADDRESS_ID and the replacement of the redundancy circuit are performed both with the use of the EFUSEs.

Since the arrangement of the internal circuit for redundancy circuit replacement shown in FIG. 11 is substantially the same as that of the chip's internal circuit shown in FIG. 6, the operation of the internal circuit shown in FIG. 11 and test flow are the same as the operation of the chip's internal circuit shown in FIG. 6 and its test flow.

In the internal circuit shown in FIG. 11, an EFUSE latch circuit 1 and address comparing circuit 2 are formed on the TEG region outside the chip in the memory wafer or on the dicing line. And on EFUSE program control circuit 3, EFUSE circuit 4 and EFUSE latch circuit 5 are formed in the chip.

Since the EFUSE fuse latch circuit 1 for detecting a defect chip on a DS tester in a parallel testing state and address comparing circuit 2 are not required after address information of a defect bit for redundancy circuit replacement has been written into the EFUSE circuit 4, these can be formed on the TEG region outside the chip or on the dicing line and cut off from the chip by the chip dicing step.

If the semiconductor memory device according to the third embodiment having the internal circuit configured as shown in FIG. 11 is used, it is possible to detect any defect chip by the DS tester in a parallel testing state and effect a redundancy circuit replacement as in the case of the first embodiment.

(Third Modified Embodiment)

Figure 12:
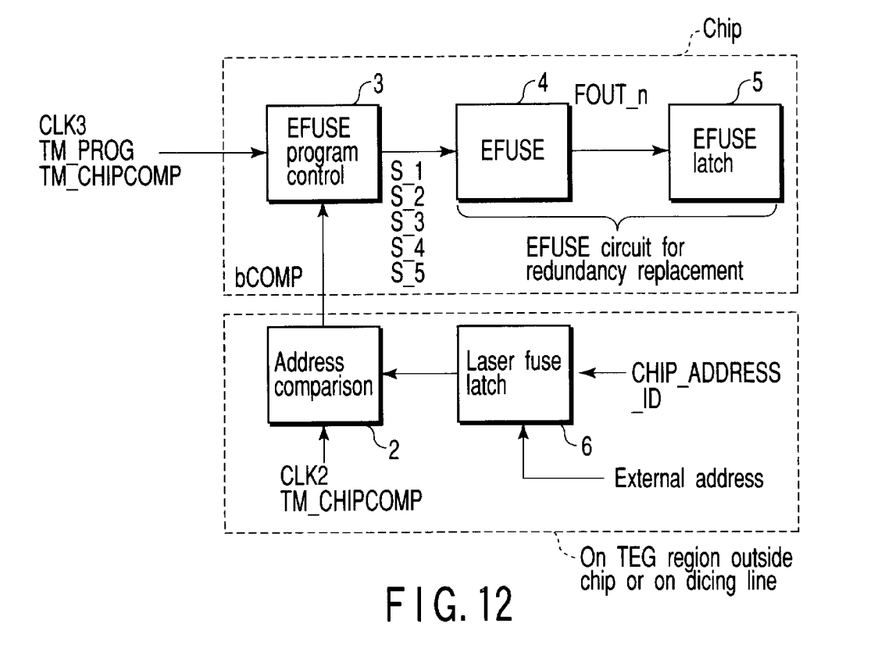
FIG. 12 is a view showing an internal circuit arrangement of a semiconductor memory device according to a third modified embodiment.

With reference to FIG. 12, an explanation will be made about a modification (a third modified embodiment) of the third embodiment.

In the third modified embodiment, as shown in FIG. 12, a chip address CHIP_ADDRESS_ID is written in the laser fuse as in the case of the first modified embodiment and the redundancy circuit replacement is effected with the use of the EFUSE.

Since the arrangement of the internal circuit for redundancy circuit replacement as shown in FIG. 12 is substantially the same as that of the chip's internal circuit shown in FIG. 8, the operation of the internal circuit and test flow of the third modified embodiment are the same as those of the first modified embodiment.

In the arrangement of the internal circuit shown in FIG. 12, the laser fuse latch circuit 6 and address comparing circuit 2 are formed on a TEG formation region outside the chip on a wafer or on a dicing line and the EFUSE program control circuit 3, EFUSE circuit 4 and EFUSE latch circuit 5 are formed in the chip.

Since the laser fuse latch circuit 6 for detecting a defect chip on the DS tester in a parallel testing state and address comparing circuit 2 are not required after the address information of the defect bit for redundancy circuit replacement has been written onto the EFUSE of the EFUSE circuit 4, those can be formed outside the chip and cut off from the chip at the chip dicing step.

In the semiconductor memory devices of the third embodiment and third modified embodiment, if a plurality of defect chips are present in parallel testing chips, the program operation of the EFUSE circuit for redundancy circuit replacement can be performed, as in the first embodiment and first modified embodiment, with respect to a plurality of defect chips and it is, therefore, possible to achieve the reduction of the testing time and testing cost.

(Fourth Embodiment)

With reference to FIGS. 13A to 17, an explanation will be made below about the semiconductor memory device according to a fourth embodiment. In the fourth embodiment, an explanation will be made below about a practical circuit configuration of an internal circuit for redundancy circuit replacement.

Figure 13A:
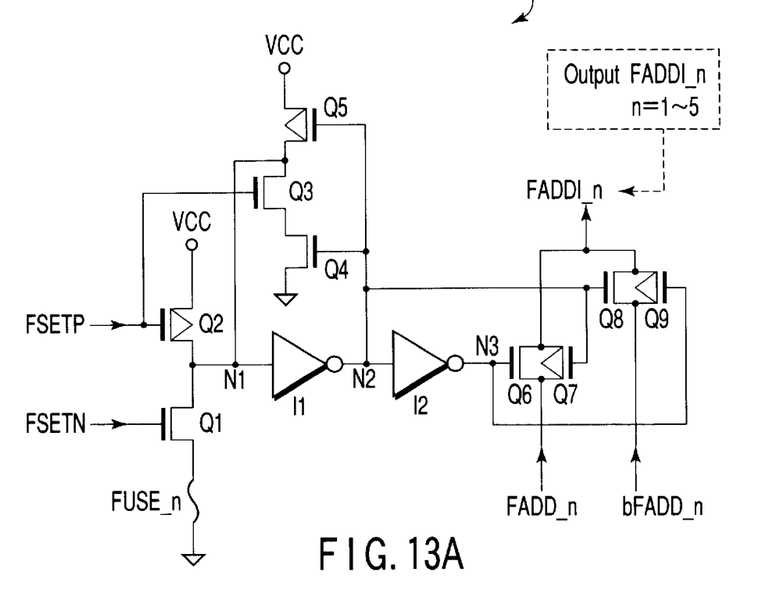
FIG. 13A is a view showing an arrangement of a laser fuse latch circuit according to a fourth embodiment.

FIG. 13A is a view showing an arrangement of a laser fuse latch circuit 6 shown in FIGS. 8 and 12. If in FIG. 13A the FUSE_n (laser fuse) is simply replaced by the EFUSE_n and the ON/OFF is simply inverted, then a resultant circuit can be used as an EFUSE latch circuit 1 shown in FIGS. 6 and 11. Here, an explanation will be made below about the case of writing the chip address CHIP ADDRESS_ID onto the FUSE_n.

In the DS testing in a parallel testing state of, for example, 32 chips, the CHIP_ADDRESS_ID is initially written by the laser blowing machine on the FUSE_n (n=1 to 5) corresponding to five bits for identifying 32 chips. In FIG. 13A is shown a laser fuse latch circuit connected to any one of the FUSE_n.

Figure 13B:
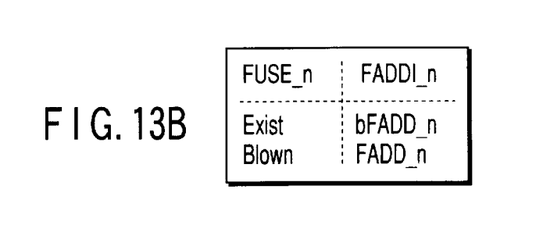
FIG. 13B shows a truth table showing the operation of the circuit shown in FIG. 13A.

As indicated in a truth table of FIG. 13B, if the FUSE_n of the laser fuse latch circuit "exists" (ON state) and initializing signals FSETN and FSETP are set to a "H" level, then Q1 is turned ON and Q2 is turned OFF. A node N1 is set to an "L" level and a node N2 is set to the "H" level through an inverter I1.

Since the "H" level of the FSETP is inputted to the gate of Q3, the Q3 is turned ON and, since the "H" level on the node N2 is inputted to the gates of Q4 and Q5, the Q4 is turned ON and Q5 is turned OFF. The "L" level is fed back to the node N1 and the node N2 is set to a "H" level and a node N3 is latched to an "L" level through the inverter I2.

Since the "H" level on the node N2 is inputted to the gates of Q7 and Q8 and the "L" level on the node N3 is inputted to the gates of Q6 and Q9, a transfer gate comprised of the Q6 and Q7 is turned OFF and a transfer gate comprised of the Q8 and Q9 is turned ON. And as shown in FIG. 13B, with the laser fuse FUSE_n in an ON state, an input signal FADDI_n is outputted as bFADD_n from the laser fuse latch circuit to next-stage address comparing circuit 2.

Similarly, if the initializing signals FSETN and FSETP of the laser fuse latching circuit are set to a "L" level with the laser fuse FUSE_n in a blown (OFF) state, then an input signal FADDI_n is outputted as an FADD_n from the laser fuse latch circuit 6 to the next-stage address comparing circuit 2.

Only if, in this way, matching is made between the CHIP_ADDRESS_ID initially written into the laser FUSE_n and the chip specifying address FADD_n of the chip including a defect bit outputted as an externally applied address from the DS tester, all the FADDI_n are set to the "H" level and inputted to the next-stage address comparing circuit 2.

Now, the arrangement and operation of the address comparing circuit 2 as shown in FIGS. 6, 8, 11, and 12 will be explained below with reference to FIG. 14.

Figure 14:
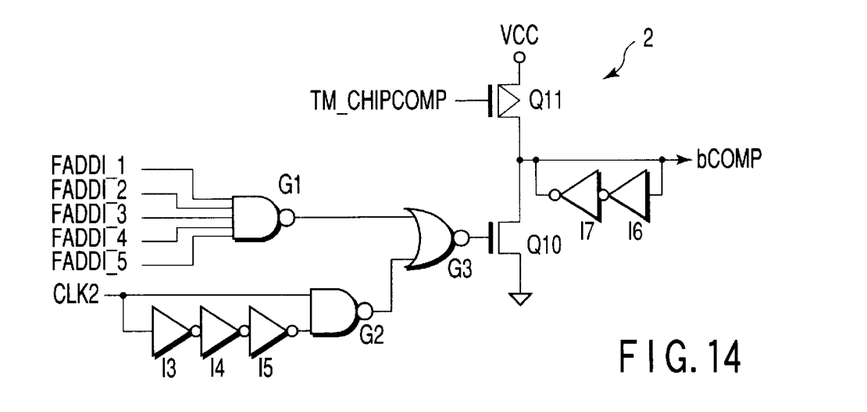
FIG. 14 is a view showing an arrangement of an address comparing circuit in the fourth embodiment.

In FIG. 14, an FADDI n (n=1 to 5) are inputted to a NAND gate G1 and, if any "L" level is included into the FADDI_n (no matching is obtained between the CHIP_ADDRESS_ID and the FADD_n), the output of the NAND gate G1 is set to a "H" level and the output of an OR gate G3 is set to a "L" level. Therefore, with a transistor Q10 in an OFF state, a transistor Q11 is turned ON if a chip comparing signal TM_CHIPCOMP entering a chip comparing test mode is set to a "L" state. And a chip comparing signal bCOMP outputted from the address comparing circuit 2 is set to a "H" level. Here, inverters 16 and 17 constitute a latch circuit for latching the comparing signal bCOMP.

Then if matching is made between the chip address CHIP_ADDRESS_ID and the chip specifying address FADD_n from the DS tester and the FADDI_n are set all to a "H" level, then the output of the NAND gate G1 is set to a "L" level and a clock CLK2 is outputted from the NOR gate G3 through an NAND gate G2. Here, inverters 13, 14 and 15 constitute a delay circuit for determining a rising pulse width of the clock CLK2.

If a rising pulse of the clock CLK2 is inputted through the NOR gate G3 to the gate of the transistor Q10, the transistor Q10 is turned ON and a chip comparing signal TM_CHIPCOMP is set to a "H" level. Therefore, the transistor Q11 is turned OFF and a negative comparing signal bCOMP synchronized with a rising pulse of the clock CLK is delivered as an output.

Then with reference to FIGS. 15 and 16, an explanation will be made below about the arrangement and operation of the EFUSE program control circuit 3 and EFUSE circuit 4 shown in FIGS. 6, 8, 11 and 12.

Figure 15:
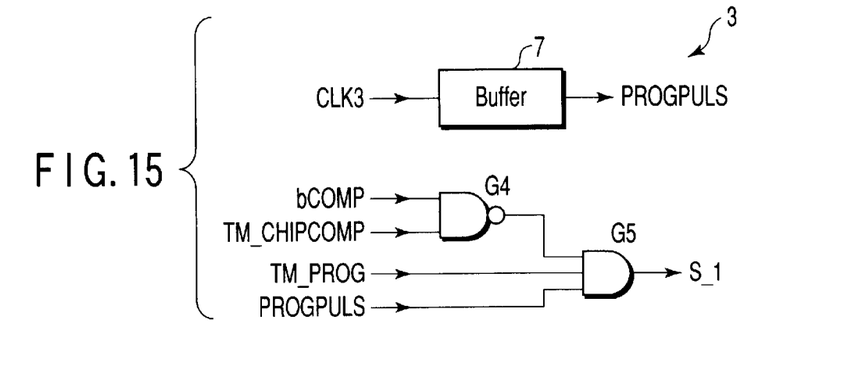
FIG. 15 is a view showing an arrangement of an EFUSE program control circuit in the fourth embodiment.

In the EFUSE program control circuit shown in FIG. 15, a clock CLK3 is inputted and a program pulse signal PROGPULS are outputted. Further, a comparing signal bCOMP and chip comparing signal TM_CHIPCOMP are inputted to an NAND gate G4. By inputting an output of G4, program signal TM PROG and program pulse signal PROGPLUS to an AND gate G5, a control signal S_1 necessary to the write operation and read operation relative to the EFUSE for redundancy circuit replacement is outputted in which case the next-stage EFUSE circuit 4 is used.

Although, in addition to the circuit for outputting the control signal S_1, those circuits outputting control signals S_2, S_3, S_4 and S_5 are included here, these are not essential and further explanation of it is, therefore, omitted.

Figure 16:
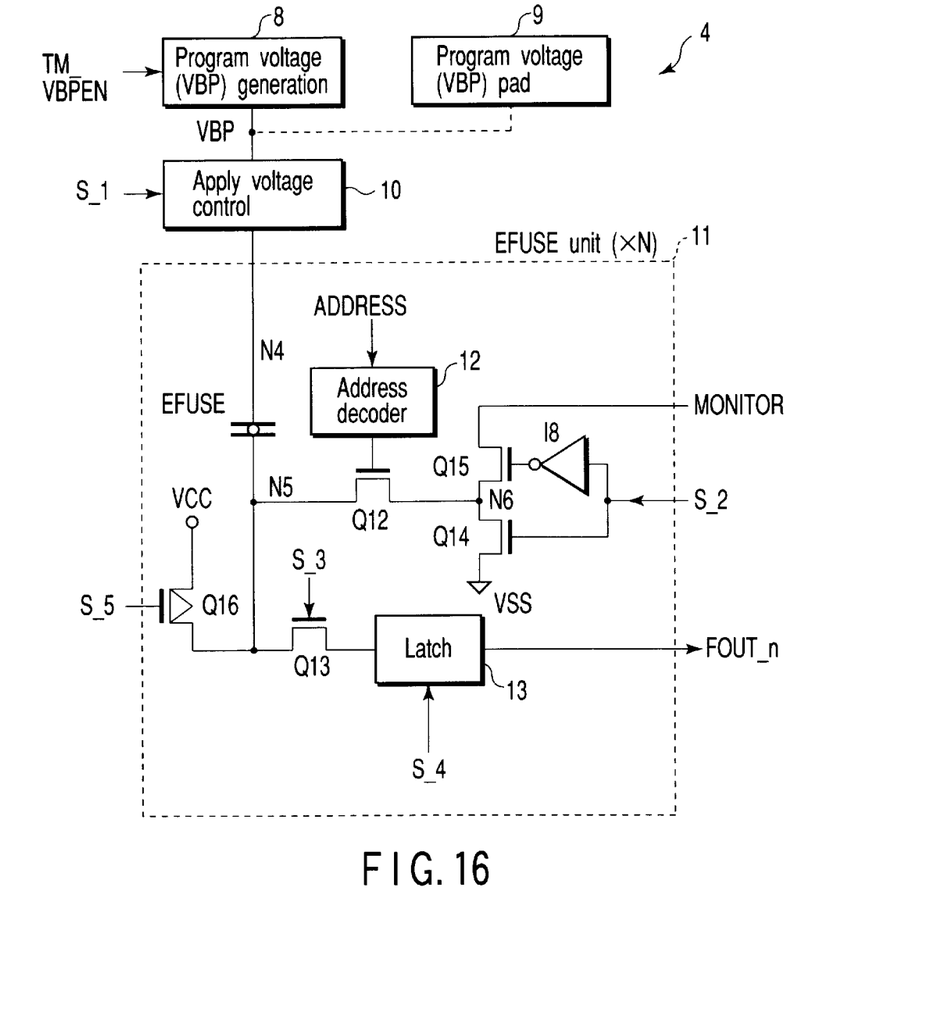
FIG. 16 is a view showing an arrangement of an EFUSE circuit in the fourth embodiment.

With reference to FIG. 16, an explanation will be made below about the write operation and read operation relative to the EFUSE for redundancy circuit replacement in the EFUSE circuit.

(1) EFUSE Writing Operation

If, in FIG. 16, an enable signal TM_VBPEN is set to a "H" level, a program voltage (write voltage VBP) generation circuit 8 is enabled to generate a write voltage VBP.

An EFUSE for breaking down a capacitor's insulating film of a DRAM cell and writing an address requires a voltage of usually about 8V as a write voltage VBP. It is to be noted that the write voltage generation circuit 8 may be provided in the chip or a write voltage VBP may be applied from outside the chip through a program voltage application pad 9. Thus a circuit configuration having the write voltage generation circuit 8 as an external circuit is included within a range of the present invention.

An apply voltage control circuit 10 is controlled by the use of the control signal S_1. At a write operation time, the write voltage VBP is applied through a node N4 to one terminal of the EFUSE during a time corresponding to a pulse width of the control signal S_1 (CLK3). During the remaining time, a voltage on the node N4 becomes a VCC level. A control signal S_5 is dropped once down to a "L" level, pulsewise, before the write operation and, therefore, a node N5 is precharged to the VCC level.

A control signal S_2 becomes a "H" level at the write operation time to set the gate of a transistor Q14 to a "H" level and, through an inverter I8, the gate of a transistor Q15 to a "L" level. As a result, a node N6 connected to a source side of a transistor Q12 becomes a VSS.

The EFUSE which is written with address data ADDRESS is selected by decoding an address line with the use of an address decoder 12. The other terminal of the selected EFUSE is connected through the node N5 to the drain side of the transistor Q12 and, if the gate of the transistor Q12 is set to a "H" level by the output of the address decoder 12, the transistor Q12 is turned ON and the node N5 is set to the VSS.

Since, in this way, the node N4 on the one terminal side of the selected EFUSE is set to a VBP and the node N5 on the other end side thereof is set to the VSS, the selected EFUSE is written (blown) with address data. In the non-selected EFUSE, the N4 is set to the VBP but the N5 is set to a VCC, so that the non-selected EFUSE is in a not-written state. It is to be noted that, at the write operation time, the control signal S_3 becomes a "L" level and transistor Q13 is turned OFF and, hence, a latch circuit 13 controlled by a control signal S_4 is not affected by the write operation.

In the EFUSE circuit 4 shown in FIG. 16, the EFUSE circuit 11 enclosed by the dotted line is provided by the number equal to the number of bits, N, of the address data. Here, the number of bits, N, of the address data is equal to the number of EFUSEs for redundancy circuit replacement. Incidentally, the terminal MONITOR of the EFUSE unit 11 constitutes a terminal which is used to monitor, from a pad, electric current flowing through the EFUSE after the write operation has been done with the control signal S2 set to a "L" level.

(2) EFUSE Reading Operation

The EFUSE reading operation means taking, into the latch circuit 13, the address data which has been written into the EFUSE. At the read operation of the FUSE, no write voltage VBP is outputted since the enable signal TM_VBPEN of the program voltage generation circuit 8 is set to a "L" level. Further, the control signal S_1 is set to a "L" and the node N4 is set to the VCC.

At the read operation, the control signal S_3 becomes a "H" level and a transistor Q13 is turned ON. In the case where the EFUSE is set to a written state (the insulating film is blown to an ON state), electric current flows from the node N4 set to the voltage VCC and, since the latch circuit 13 is inverted, the output FOUT_n becomes a "L" state.

In the case where, on the other hand, the EFUSE is set to a non-written state, the latch circuit is not inverted and the output FOUT_n becomes a "H" level. In this way, the initialization of the latching circuit 13 and the take-in of the address data written into the EFUSE are effected with the use of the control signal S_4.

Figure 17A:
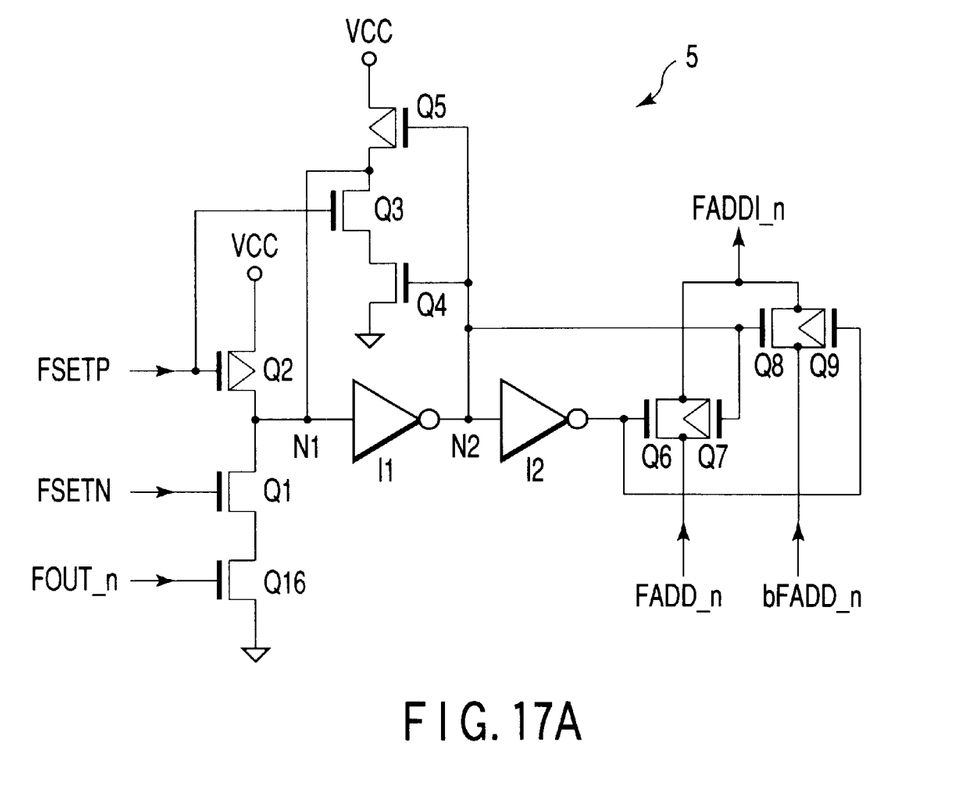
FIG. 17A is a view showing an arrangement of an EFUSE latch circuit in the fourth embodiment.
Figure 17B:
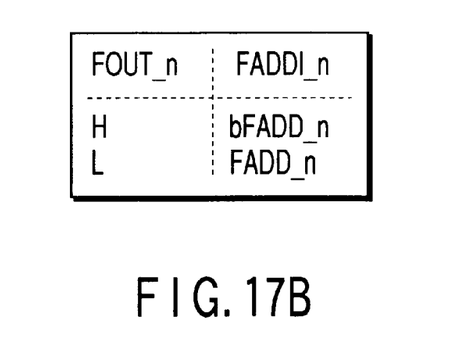
FIG. 17B is a truth table showing the operation of the circuit shown in FIG. 17A.

With reference to FIG. 17, an explanation will be made below about the arrangement of the EFUSE latch circuit 5 for redundancy circuit replacement shown in FIGS. 6, 8, 11 and 12.

The EFUSE latch circuit 5 for redundancy circuit replacement as shown in FIG. 17A is such that, in the laser fuse latch circuit 6 shown in FIG. 13A, a transistor Q16 operated upon receipt of an output FOUT_n of the preceding-stage EFUSE circuit 4 is simply inserted in place of the laser fuse FUSE_n. Therefore, any detailed explanation of it is, therefore, omitted.

The EFUSE latch circuit 5 is switched according to a logic level of the output FOUT_n of the preceding-stage EFUSE circuit 4. And the fuse address data FADD_n or its inverted data bFADD_n is outputted as address data FADDI_n for redundancy circuit replacement. An FSETP and FSETN constitute an initializing signal, each, of the EFUSE latch circuit at a power-on time.

An explanation will be made below about the case where the EFUSE latch circuit 5 shown in FIG. 17A is used as the EFUSE latch circuit 1 for the chip address CHIP_ ADDRESS_ID shown in FIG. 11.

The writing the chip address CHIP_ADDRESS_ID into the EFUSE and outputting of the read signal FOUT_n are effected by using the EFUSE circuit 4 shown in FIG. 16. At this time, the number of EFUSE units, N, corresponds to the bit number OF CHIP_ADDRESS_ID.

The problem encountered upon writing the address information into the EFUSE in place of doing this into the laser fuse is how to write different CHIP_ADDRESS_ID to respective chips on the DS tester while being in a parallel testing state. In the EFUSE which is written with address information through the breakdown of the capacitor's insulating film in the DRAM cell, however, there is seen a wide variation in resistances (resistances of the capacitors' insulating films) of the EFUSEs in the same chip after such breakdown.

The resistance of the EFUSE after the breakdown can be found by setting the control signal S_2 to a "L" level in FIG. 16 and measuring electric current in such a state that the terminal MONITOR connected to the pad is set to a 0V. This can be utilized by initially breaking down the EFUSE and effecting a comparison between the current flowing through the capacitor's insulating film after the breakdown and a reference current applied from outside the chip and, by doing so, providing a corresponding logic value. If this method is used, the CHIP_ADDRESS_ID can be provided by utilizing a variation among the resistances of the EFUSEs.

If, for example, a post-breakdown current of 100 μA flows through the EFUSE in the chip A and 200 μA flows through the EFUSE in the chip B, it is possible to identify the chips A and B by flowing a current as a reference from a tester, comparing these currents with the reference current from the tester by means of a formed comparing circuit in the chip so as to see whether these currents are greater or smaller than the reference current.

The present invention is not restricted to the above-mentioned embodiments. Although, in the first and second embodiments for example, the EFUSE has been explained as being used as an electrically programmable nonvolatile memory element and, in more detail, the EFUSE has been explained as being written with the address information by way of an example by breaking down the capacitor's insulating film of the DRAM cell, the present invention is not necessarily restricted to the use of the above-mentioned EFUSE.

The same control system can be realized by using the above-mentioned EFUSE and by generally using the electrically programmable non volatile memory element. Further, various changes and modifications of the present invention can be made without departing from the spirit and scope of the present invention.

According to the semiconductor memory device having the internal circuit of the present invention, any defect chip can be detected on the DS tester while being in a parallel testing state and the redundancy circuit replacement be effected. It is, therefore, possible to achieve the reduction of the testing time and testing cost.

What is claimed is:

1. A semiconductor memory device comprising:
   an address comparing circuit configured to make a comparison between a chip specifying address applied from an outside and a chip address programmed in a first nonvolatile memory element;
   a control circuit configured to control an activating state of an internal circuit included in the semiconductor memory device by using a result of comparison; and
   a test mode which activates the address comparing circuit and control circuit.

2. A semiconductor memory device according to claim 1, wherein the first nonvolatile memory element is comprised of an element configured to be electrically open- and short-circuited by applying a voltage or a current thereto.

3. A semiconductor memory device according to claim 1, wherein the first nonvolatile memory element is comprised of a capacitor's insulating film of a DRAM cell or a gate insulating film of a MOS transistor.

4. A semiconductor memory device according to claim 1, wherein the first nonvolatile memory element is comprised of a flash memory, an EEPROM, an FeRAM or an MRAM cell.

5. A semiconductor memory device according to claim 1, wherein the first nonvolatile memory element is comprised of a metal fuse or a polysilicon fuse which is electrically open-circuited by applying a higher voltage or a high density current thereto.

6. A semiconductor memory device according to claim 1, wherein the first nonvolatile memory element is comprised of a metal fuse which is open-circuited by applying a laser irradiation.

7. A semiconductor memory device according to claim 1, wherein the first nonvolatile memory element is formed on a dicing line outside of a chip or on a TEG region and the internal circuit is so configured as to allow only an output signal as a result of comparison to be coupled by a connection line to an inside of the chip.

8. A semiconductor memory device according to claim 1, wherein the internal circuit includes a circuit configured to allow programming information for replacing with a redundancy circuit on a second electrically programmable nonvolatile memory element with the replacing information.

9. A semiconductor memory device according to claim 8, wherein the first and second nonvolatile memory elements each are comprised of an element configured to be electrically short- or open-circuited by applying a voltage or a current thereto.

10. A semiconductor memory device according to claim 8, wherein the first and second nonvolatile memory elements each are comprised of a capacitor's insulating film of a DRAM cell or a gate insulating film of a MOS transistor.

11. A semiconductor memory device according to claim 8, wherein the first and second nonvolatile memory elements each are comprised of a flash memory, an EEPROM, an FeRAM or an MRAM cell.

12. A semiconductor memory device according to claim 8, wherein the first and second nonvolatile memory elements each are comprised of a metal fuse or polysilicon fuse configured to be electrically open-circuited by applying a higher voltage or higher density current thereto.

13. A semiconductor memory device according to claim 8, wherein the first nonvolatile memory element is comprised of a metal fuse which is open-circuited by applying a laser irradiation and the second nonvolatile memory element is comprised of a capacitor's insulating film of a DRAM cell, a gate insulating film of a MOS transistor, a flash memory cell, an EEPRM, an FeRAM, an MRAM cell or a polysilicon fuse which is electrically open-circuited by applying a higher voltage or a high density current thereto.

14. A semiconductor memory device according to claim 8, wherein the first nonvolatile memory element is formed on a dicing line outside a chip or on a TEG region and the internal circuit is so configured as to allow only an output signal as a result of comparison to be coupled by a connection line to an inside of the chip.

15. A semiconductor memory device according to claim 1, wherein the test mode is set at a testing time of the semiconductor memory device in a parallel testing state, the comparing circuit is so configured as to make a comparison between a chip address initially programmed on all chips at a testing time and an externally applying chip specifying address of a chip retrievable with redundancy circuit replacement to detect the chip retrievable, in a parallel testing state, with the redundancy circuit replacement and to deliver a comparison signal as an output, and the internal circuit includes a circuit configured to receive the comparison signal to allow programming to be done on a second electrically programmable nonvolatile memory element by the redundancy circuit replacement in a chip retrievable with the redundancy circuit replacement.

16. A semiconductor memory device according to claim 15, wherein the first and second nonvolatile memory elements each are comprised of an element configured to be electrically short- or open-circuited by applying a voltage or a current thereto.

17. A semiconductor memory device according to claim 15, wherein the first and second nonvolatile memory elements each are comprised of a capacitor's insulating film of a DRAM cell or a gate insulating film of a MOS transistor.

18. a semiconductor memory device according to claim 15, wherein the first and second nonvolatile memory elements each are comprised of a flash memory, an EEPROM, an FeRAM or an MRAM cell.

19. A semiconductor memory device according to claim 15, wherein the first and second nonvolatile memory elements each are comprised of a metal fuse or a polysilicon fuse and configured to be electrically open-circuited by applying a high voltage or a high density current thereto.

20. A semiconductor memory device according to claim 15, wherein the first nonvolatile memory element is formed on a dicing line outside a chip or on a TEG region and the internal circuit is so configured as to allow only an output signal as a result of comparison to be coupled by a connection line to an inside of the chip.

21. A method for testing a semiconductor memory device using a memory wafer formed by the ending of a wafer process and a tester for testing a plurality of memory chips on the memory wafer in a parallel testing state, the plurality of memory chips each having an internal circuit for allowing a redundancy circuit replacement, the method comprising:

allowing a first nonvolatile memory element which is formed in the respective memory chip to be programmed with a chip address of the corresponding memory chip;

testing the plurality of memory chips in a parallel testing state;

making a comparison between the chip address of the respective memory chip and an externally applying chip specifying address of the chip retrievable with a redundancy circuit replacement and detecting a chip retrievable, in a parallel testing state, with the redundancy circuit replacement; and allowing programming to be done on a second electrically programmable nonvolatile element in the internal circuit with the redundancy circuit replacement.

* * * * *

UNITED STATES PATENT AND TRADEMARK OFFICE
CERTIFICATE OF CORRECTION

PATENT NO.    : 6,639,848 B2
DATED         : October 28, 2003
INVENTOR(S)   : Hiroshi Maejima It is certified that error appears in the above-identified patent and that said Letters Patent is hereby corrected as shown below:

<u>Column 14,</u>
Lines 50 and 59, please replace "device" with -- cell --.

Signed and Sealed this

Third Day of February, 2004

JON W. DUDAS
*Acting Director of the United States Patent and Trademark Office*